(12) United States Patent
Chiang et al.

(10) Patent No.: US 7,760,845 B2
(45) Date of Patent: Jul. 20, 2010

(54) SHIFT REGISTER FOR A LIQUID CRYSTAL DISPLAY

(75) Inventors: Chien-Hsueh Chiang, Miao-Li (TW); Sz-Hsiao Chen, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 75 days.

(21) Appl. No.: 12/217,340

(22) Filed: Jul. 3, 2008

(65) Prior Publication Data
US 2009/0010379 A1  Jan. 8, 2009

(30) Foreign Application Priority Data
Jul. 6, 2007 (CN) .................. 2007 1 0075837

(51) Int. Cl.
*G11C 19/00* (2006.01)

(52) U.S. Cl. .................. 377/64; 377/70; 377/74; 377/79

(58) Field of Classification Search ............. 377/64, 377/69–74, 77–79
See application file for complete search history.

(56) References Cited

U.S. PATENT DOCUMENTS

| 5,289,518 | A | * | 2/1994 | Nakao | 377/81 |
| 5,498,988 | A | * | 3/1996 | Reyes et al. | 327/199 |
| 5,703,513 | A | * | 12/1997 | Hashizume et al. | 327/202 |
| 7,027,550 | B2 | | 4/2006 | Lin | |
| 7,420,391 | B2 | * | 9/2008 | Pesci | 326/46 |
| 2005/0018807 | A1 | * | 1/2005 | Han et al. | 377/69 |
| 2008/0253500 | A1 | * | 10/2008 | Tso et al. | 377/69 |

* cited by examiner

*Primary Examiner*—Tuan Lam
(74) *Attorney, Agent, or Firm*—Raymond J. Chew (57) ABSTRACT

A shift register of the present disclosure switches on and off various transistors in order to reduce power consumption. A high input voltage source and a low input voltage source of the shift register are spaced apart from each other so as to reduce signal noise distortion between the voltage sources. The shift register may be employed in a liquid crystal display (LCD).

19 Claims, 6 Drawing Sheets

SHIFT REGISTER FOR A LIQUID CRYSTAL DISPLAY

FIELD OF THE INVENTION

This invention relates to a shift register, and more particularly to a shift register for a liquid crystal display (LCD).

GENERAL BACKGROUND

Shift registers are core circuit units of integrated circuits that are used in products such as thin film transistor liquid crystal displays (TFT-LCDs). A shift register provides sequential pulse signals to scanning lines of a TFT-LCD, so as to control on and off states of TFTs connected to the scanning lines.

Figure 6:
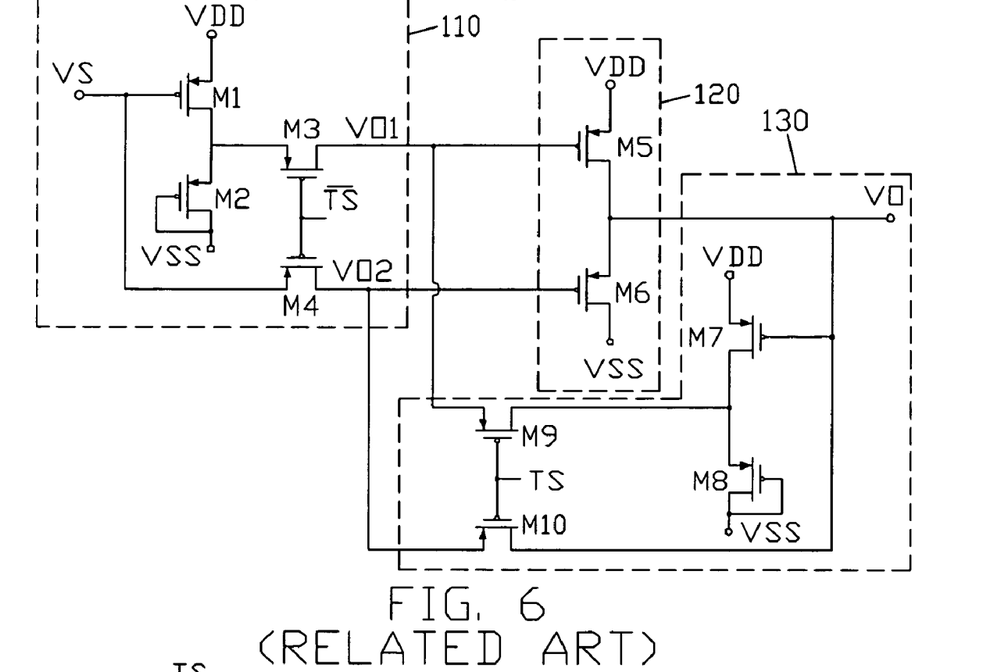
FIG. 6 is a circuit diagram of a shift register unit of a conventional shift register.

Referring to FIG. 6, one such shift register unit 100 includes a first clock inversion circuit 110, an inverter 120, and a second clock inversion circuit 130. All transistors in the first clock inversion circuit 110, the inverter 120, and the second clock inversion circuit 130 are PMOS (P-channel metal oxide semiconductor) transistors. The first clock inversion circuit 110 receives an output signal VS from a pre-stage shift register unit (not shown). The output signal VS functions as a start signal.

The first clock inversion circuit 110 includes a first transistor M1, a second transistor M2, a third transistor M3, a fourth transistor M4, a first output VO1, and a second output VO2. The inverter 120 includes a fifth transistor M5 and a sixth transistor M6. The inverter 120 outputs an output signal that serves as a shift register signal VO. The second clock inversion circuit 130 and the first clock inversion circuit 120 have similar structures. The second clock inversion circuit 130 includes a seventh transistor M7, an eighth transistor M8, a ninth transistor M9, and a tenth transistor M10.

Figure 7:
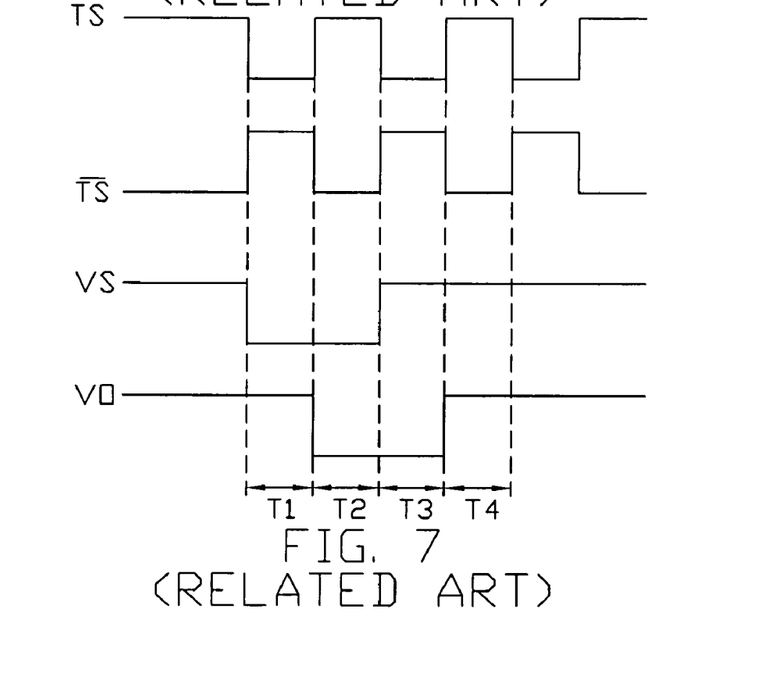
FIG. 7 is a sequence waveform diagram of pulse signals of the shift register of FIG. 6.

Referring to FIG. 7, a sequence waveform diagram of pulse signals of the shift register unit 100 is shown. During a period t1, the inverter 120 and the second clock inversion circuit 130 perform a latch operation. During the latch operation, the sixth transistor M6 is switched off such that the shift register signal VO of the inverter 120 keeps an original state of the previous stage. During a period t2, no latch operation is performed. The start signal VS is applied to the inverter 120, and the second clock inversion circuit 130 keep the same state as the start signal VS. Furthermore, the first transistor M1 is switched on because the start signal VS jumps to a low voltage, such that the fifth transistor M5 is switched off and the sixth transistor M6 is switched on. Thus, the inverter 120 outputs the shift register signal VO having a low level through the activated sixth transistor M6. During a period t3, the inverter 120 and the second clock inversion circuit 130 perform latch operation the inverter 120 maintains output of a low level shift register signal VO through the activated sixth transistor M6. During a period t4, no latch operation is performed. The inverter 120 stops output of the low-level shift register signal VO.

The shift register unit 100 outputs a low level shift register signal during period t2, and at the same time, the next-stage shift register unit (not shown) also outputs a low level shift register signal. Thus, adjacent shift register units (e.g., the shift register unit 100 and the next-stage shift register unit) may cause signal distortions between adjacent shift register units due to overlapping adjacent shift register signals. As a result, the shift register unit 100 is liable to be unstable. Accordingly, an LCD device employing the shift register unit 100 may have a distorted display quality because adjacent scanning lines corresponding to adjacent columns or rows of TFTs may be scanned simultaneously by the shift register pulse signals instead of being scanned sequentially. Furthermore, because the first voltage VDD is directly connected to the second voltage VSS, the shift register unit 100 has a relatively large power consumption and heat.

What is needed, therefore, is a shift register which can overcome the above-described deficiencies. What is also needed is an LCD device including the shift register.

SUMMARY

One embodiment of a shift register is disclosed. In one embodiment, a shift register includes at least two clock transmission lines configured for transmitting a first clock pulse and a second clock pulse, and a plurality of stages receiving the clock pulses from the at least two clock transmission lines, and outputting a plurality of output-signals in sequence. The first clock pulse and the second clock pulse have an amplitude, a duty ratio, and a frequency, and the first clock pulse has an inverse phase relative to a phase of the second clock pulse. A first alternating stage of the plurality of stages receives the first clock pulse, and wherein a second alternating stage of the plurality of stages receives the second clock pulse. Each of the stages includes a voltage high input, a voltage low input, a first output, a second output, an input, a first inverter, a second inverter, a voltage circuit, and an input circuit. The voltage high input receives a high-level voltage signal, and the voltage low input receives a low-level voltage signal. The second output of the first alternating stage inputs a signal into the input of the second alternating stage. The input circuit is configured receiving the first clock pulse and the second clock pulse for generating a pulse signal to the first output. The pulse signal is configured according to the first clock pulse, the second clock pulse, and an input from one of the first alternating stage and the second alternating stage. The first inverter includes an input terminal connected to the first output. The voltage circuit is configured for providing a high-level signal and a low-level signal under control of the input, an output of the first inverter, the first output, and the second output to a common node of the voltage circuit. The second inverter includes an output connected to the second output, and an input connected to the common node.

Other novel features and advantages will become more apparent from the following detailed description when taken in conjunction with the accompanying drawings.

DETAILED DESCRIPTION OF CERTAIN INVENTIVE EMBODIMENTS

Figure 1:
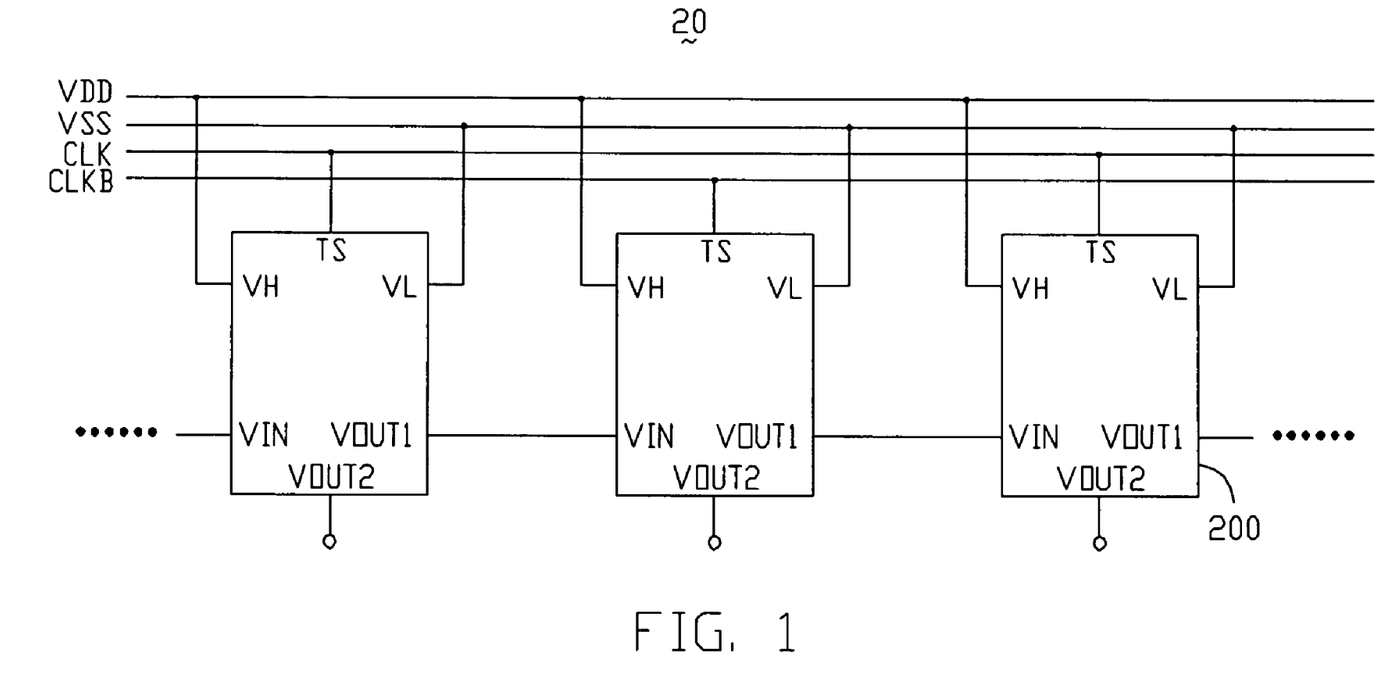
FIG. 1 illustrates a circuit diagram of one embodiment of a shift register of the present disclosure comprising a plurality of shift register units.

FIG. 1 illustrates a circuit diagram of one embodiment of a shift register 20 of the present disclosure comprising a plurality of shift register units 200. The shift register unit 200 comprises a clock input TS, an input VIN, a first output VOUT1, a second output VOUT2, a high level input VH, and a low level input VL. The second output VOUT2 is configured to output a shift register signal to an external circuit (not shown) according to a signal applied to the input VIN of the shift register 20. The first output VOUT1 of the last shift register unit is a floating output.

The clock input TS has a first clock signal CLK or a second clock signal CLKB applied thereto, which are both provided by an external circuit (not shown). It should be noted that the clock inputs TS of two adjacent shift register units have the first and second clock signals applied thereto, alternately.

A high level signal, such as a high level voltage VDD, may be inputted to the high level input VH of the shift-register unit 200. A low level signal, such as a ground voltage VSS, may be inputted to the low level input VL of the shift-register unit 200. The input VIN is connected to the first output VOUT of a preceding shift-register unit of the shift-register unit 200. The first output VOUT1 is connected to an input VIN of a next-stage shift register unit of the shift-register unit 200.

In one embodiment, the first clock signal CLK and the second clock signal CLKB may be substantially identical in amplitude, duty ratio, and frequency, but are inverse in phase relative to each other. In one embodiment, a duty ratio of the first clock signal CLK and second clock signal CLKB may be 50%.

Figure 2:
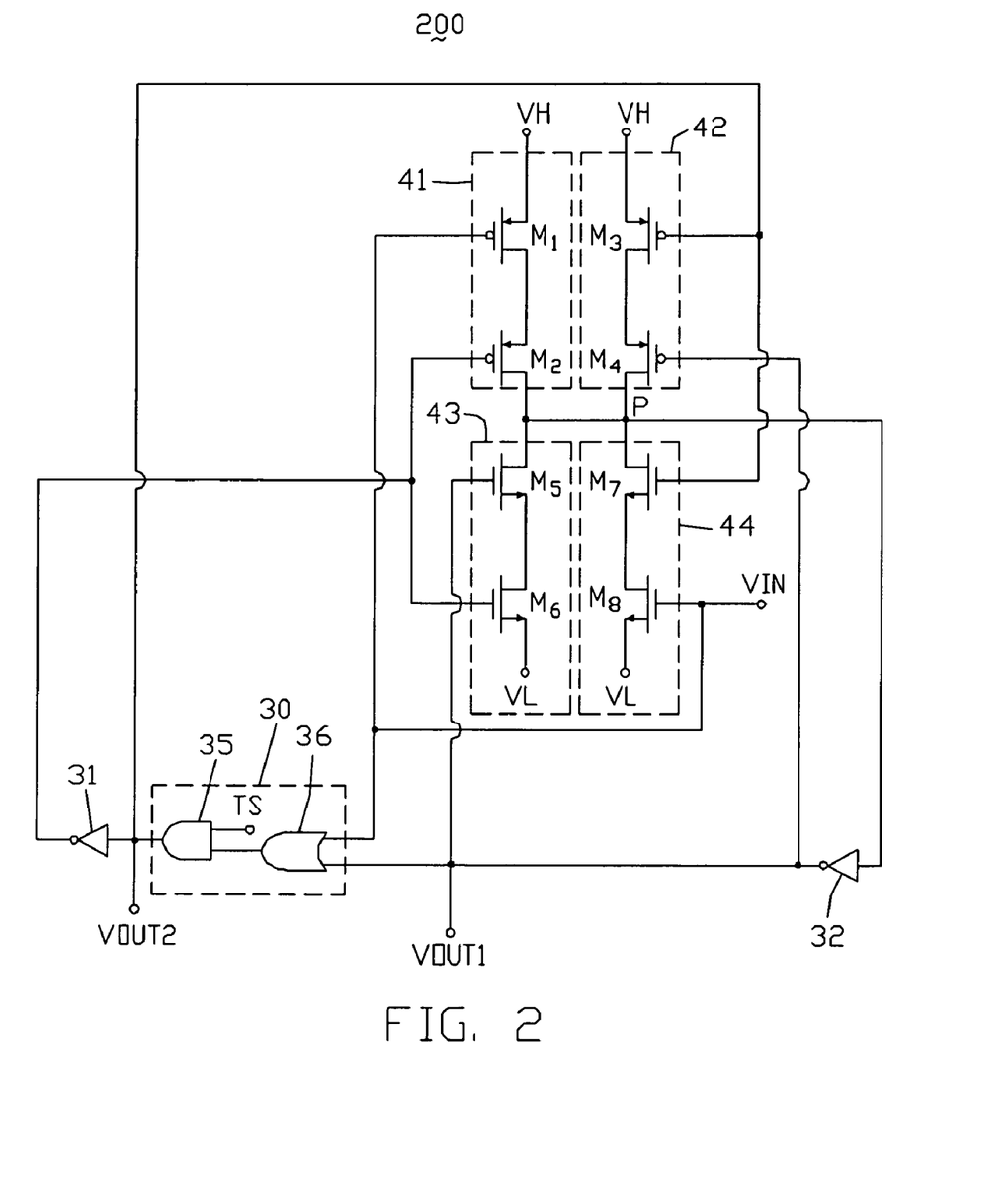
FIG. 2 illustrates a low-level schematic diagram of one embodiment of the shift register unit.

FIG. 2 illustrates a low-level schematic diagram of one embodiment of the shift register unit 200. In one embodiment, the shift register unit 200 includes an input circuit 30, a first inverter 31, a second inverter 32, a first output circuit 41, a second output circuit 42, a third output circuit 43, and a fourth output circuit 44. The first to the fourth output circuits 41-44 are connected to a common node P. The first output circuit 41 and the second output circuit 42 are used for providing the high level voltage VDD to the common node P. The third and fourth output circuits 43, 44 are used for providing the low level voltage VSS to the common node P.

The input circuit 30 includes an AND gate 35 and an OR gate 36. The first output circuit 41 includes a first transistor M1 and a second transistor M2 connected in series. The second output circuit 42 includes a third transistor M3 and a fourth transistor M4 connected in series. The third output circuit 43 includes a fifth transistor M5 and a sixth transistor M6 connected in series. The fourth output circuit 44 includes a seventh transistor M7 and an eighth transistor M8 connected in series. The first to the fourth transistors M1-M4 are PMOS (P-channel metal oxide semiconductor) transistors, and the fifth to the eighth transistors M5-M8 are NMOS (N-channel metal oxide semiconductor) transistors. It may be understood that the first to the fourth transistors M1-M4 form a pull-up circuit for providing the high level voltage VDD to the common node P. Accordingly, it may be further understood that the fifth to the eighth transistors M5-M8 form a pull-down circuit for providing the low level voltage VSS to the common node P.

The high level voltage input VH is connected to the low level voltage VL via a source electrode and a drain electrode of the first transistor M1, a source electrode and a drain electrode of the second transistor M2, a drain electrode and a source electrode of the fifth transistor M5, a drain electrode and a source electrode of the sixth transistor M6 sequentially. The high level voltage input VH is further connected to the low level voltage input VL via a source electrode and a drain electrode of the third transistor M3, a source electrode and a drain electrode of the fourth transistor M4, a drain electrode and a source electrode of the seventh transistor M7, a drain electrode and a source electrode of the eighth transistor M8 sequentially. The drain electrodes of the second and fourth transistors M2, M4 are connected to the common node P. Gate electrodes of the first and eighth transistors M1, M8 are connected to the input VIN. Gate electrodes of the second and sixth transistors M2, M6 are connected to an output terminal of the first inverter 31. Gate electrodes of the third and the seventh transistors M3, M7 are connected to the second output VOUT2. Gate electrodes of the fourth and fifth transistors M4, M5 are connected to the first output VOUT1.

One input terminal of the OR gate 36 is connected to the input VIN, the other input terminal of the OR gate 36 is connected to the first output VOUT1, an output terminal of the OR gate 36 is connected to one input terminal of the and gate 35. The other input terminal of the and gate 35 is connected to the clock input TS, an output terminal of the and gate 35 is connected to the second output VOUT2. An input terminal of the first inverter 31 is connected to the second output VOUT2. An input terminal of the second inverter 32 is connected to the common node P, and an output terminal of the second inverter 32 is connected to the first output VOUT1.

Figure 3:
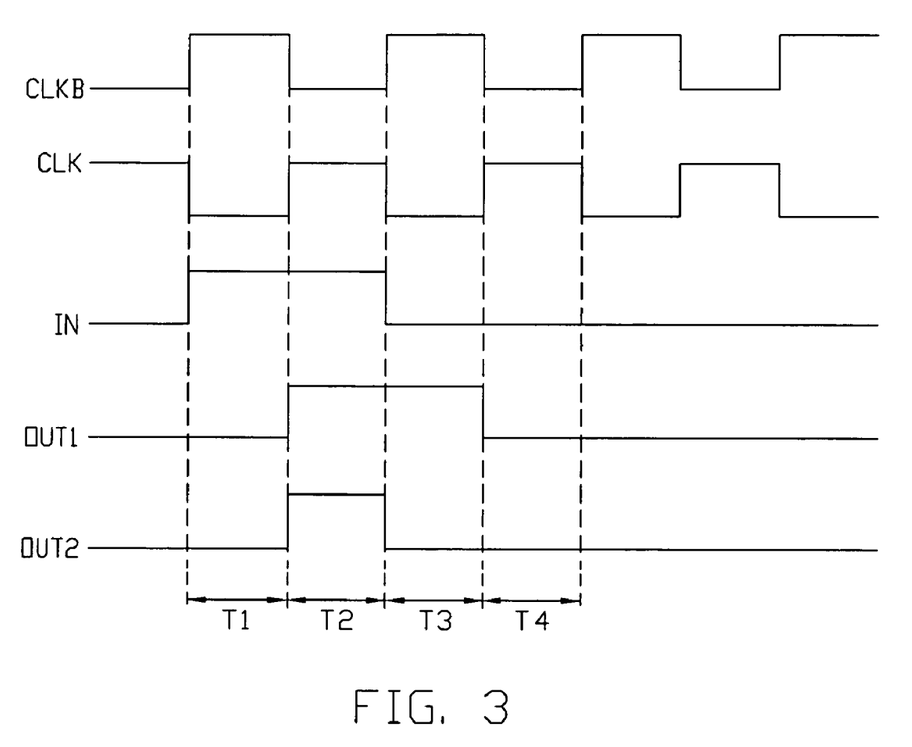
FIG. 3 illustrates a sequence waveform diagram of exemplary pulse signals of the shift register unit.

FIG. 3 illustrates a sequence waveform diagram of exemplary pulse signals of the shift register unit 200. IN represents an input signal applied to the input VIN. OUT1 represents a start pulse signal output from the first output VOUT1. OUT2 represents a shift register signal output to an external circuit from the second output VOUT2. Details of outputting signals of the shift register unit 200 will be described herein.

During a period T1, the input VIN is at high level. The eighth transistor M8 is switched on while the first transistor M1 is switched off. The input signal IN is applied to the OR gate 36, and the OR gate 36 has a high-level signal output. Because the clock signal CLK is now at a low level, the AND gate 35 outputs a low-level signal, and the second output VOUT2 outputs a low-level signal. Thus, the third transistor M3 is switched on, and the seventh transistor M7 is switched off. The low-level signal output by the AND gate 35 is turned into a high-level signal by the first inverter 31. The second transistor M2 is switched off, and the sixth transistor M6 is switched on. The first output VOUT1 is at low level, thus the fifth transistor M5 is switched off and the fourth transistor M4 is switched off. That is, the first, second, fifth, and seventh transistors M1, M2, M5, M7 are switched off. The third, fourth, sixth, and eighth transistors M3, M4, M6, M8 are switched on. Thus, only the second output circuit 42 out of the first to fourth output circuits 41, 42, 43, 44 is operative to work at an on state. The high-level voltage VDD is applied to the common node P via the second output circuit 42, and is converted by the second inverter 32 into a low-level signal. The common node P is pulled up to a high level.

During the period T2, the input signal IN jumps to a high-level signal. The eighth transistor M8 is switched on, and the first transistor M1 is switched off. The input signal IN is applied to the OR gate 36, thus the OR gate 36 outputs a high-level signal. Because the clock signal CLK is at low level now, the and gate 35 outputs a high-level signal, and the second output terminal VOUT2 outputs a high-level signal. The third transistor M3 is switched off, and the seventh transistor M7 is switched on. The high-level signal applied by the AND gate 35 is converted by the first inverter 31 into a low-level signal. Thus the second transistor M2 is switched on, and the sixth transistor M6 is switched off. That is, the first, third, fourth, and sixth transistors M1, M3, M4, M6 are switched off, and the second, seventh, eighth transistors M2, M7, M8 are switched on. Only the fourth output circuit 44 is operative to work at an on state. The low-level voltage signal VSS is applied to the common node P via the on-state fourth output circuit 44, and the common node P is therefore pulled down to a low level. The low-level voltage signal VSS is further converted into a high-level voltage signal by the second inverter 32, and the first output VOUT1 outputs a high level signal. In this circumstance, the fifth transistor M5 is switched on.

During the period T3, the input signal IN jumps to a low level. The eighth transistor M8 is switched off, and the first transistor M1 is switched on. The low-level input signal IN is applied to the OR gate 36, thus the first output VOUT1 outputs a high-level signal, the fifth transistor M5 is switched on, and the OR gate 36 outputs a high-level signal. Because the clock signal CLK is at low-level now, the and gate 35 outputs a low-level signal and the second output VOUT2 outputs a low-level signal. Thus, the third transistor M3 is switched on, and the seventh transistor M7 is switched off. The low-level signal applied by the AND gate 35 is converted into a high-level signal by the first inverter 31. The second transistor M2 is switched off, and the sixth transistor M6 is switched on. That is, the second, seventh, and eighth transistors M2, M7, M8 are switched off and the first, third, fifth and sixth transistors M1, M3, M5, M6 are switched on. Only the third output circuit 43 is operative to work at an on state. The low-level voltage signal VSS is applied to the common node P via the on-state third output circuit 43.

During the period T4, the input signal IN remains at low-level, thus the eighth transistor M8 remains off state and the first transistor M1 remains on state. The input signal IN is applied to the OR gate 36. At the moment ending the period T3 and beginning the period T4, the clock signal CLK jumps to a high level from a low level. Thus, the first output VOUT1 outputs a high-level signal, and the or gate 36 outputs a high-level signal to the AND gate 35. The and gate 35 outputs a high-level signal, thereby the second transistor M2 is switched on. The high-level voltage signal VDD is applied to the common node P via the first transistor M1 and the second transistor M2, and is further converted to a low-level signal by the second inverter 32 to the first output VOUT1. Thus, the first output VOUT1 essentially outputs a low-level signal. The fifth transistor M5 is switched off, and the fourth transistor M4 is switched on. The OR gate 36 outputs a low-level signal to the AND gate 35, thereby the and gate 35 outputting a low-level signal to the second output VOUT2 the third transistor M3 is switched on and the seventh transistor M7 is switched off. The low-level signal applied by the AND gate 35 is converted into a high-level signal by the first inverter 31, thus the second transistor M2 is switched off, and the sixth transistor M6 is switched on. That is, the second, fifth, seventh, eighth transistor M2, M5, M7, M8 are switched off, and the first, third, fourth, and sixth transistors M1, M3, M7, M8 are switched on. Only the second output circuit 42 is operative to work at an on state. The high-level voltage signal VDD is applied to the common node via the second output circuit 42, and the common node P is pulled up to a high level. The high-level voltage signal VDD is converted into a low-level signal by the second inverter 32 to the first output VOUT1.

Because the first output VOUT1 of the shift register unit 200 is connected to an input VIN of a successive shift register unit of the shift register unit 200, the output signal OUT1 of the first output VOUT1 is an input signal IN of the input VIN of successive shift register unit. The successive shift register unit receives an inverse clock signal CLKB, and has a similar working procedure as the above-described working procedure of the shift register unit 200 during the period T1-T4. A second output VOUT2 of the successive shift register unit outputs a high-level shift register signal during the period T3 following the shift register signal output by the shift register unit 200.

In summary, each of the shift register units 200 of the shift register 20 has only one of the four output circuits 41, 42, 43, 44 at an on-state at one time. Therefore, the high level input VH is not directly connected to the low level input VL, and the shift register 200 may use substantially less power due to only one of the four output circuits 41, 42, 43, 33 at an on-state at once. Additionally, shift register signals do not overlap each other that the shift register signal are output sequentially with only one shift register signal at one time. As a result, that conflicting adjacent shift register signals noise can be reduced or even eliminated resulting in increased stability in the shift register 200.

Figure 4:
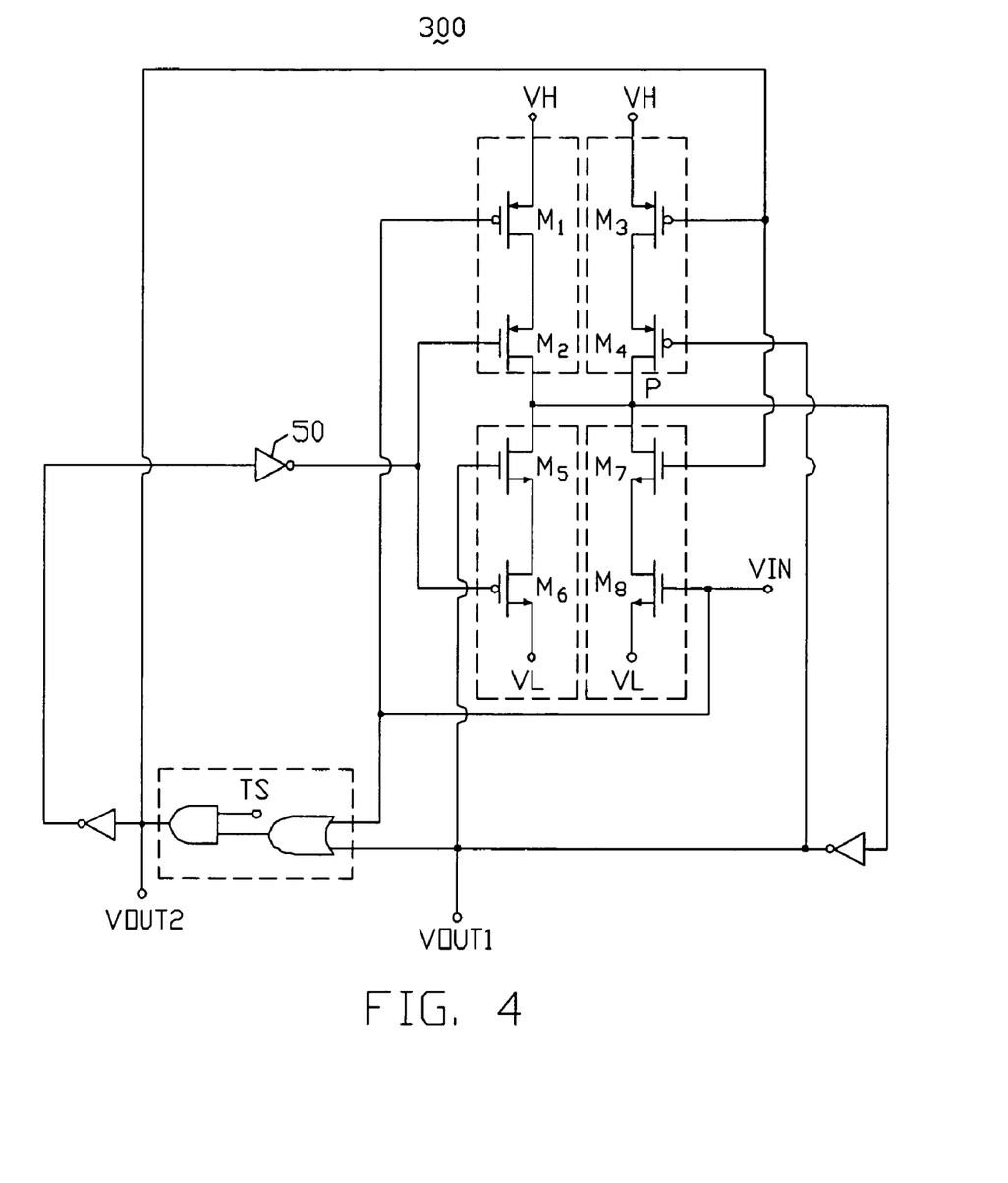
FIG. 4 illustrates a circuit diagram of another embodiment of a shift register unit of the present disclosure.

FIG. 4 illustrates a circuit diagram of another embodiment of a shift register unit 300 of the present disclosure. The shift register unit 300 has a substantially similar structure to the shift register unit 200. However, the shift register unit 300 further includes a third inverter 50. The third inverter 50 includes an input connected to an output of the first inverter, and an output connected to gate electrodes of a second transistor M2 and a sixth transistor M6. The second transistor M2 is an NMOS transistor, and the sixth transistor M6 is a PMOS transistor.

Figure 5:
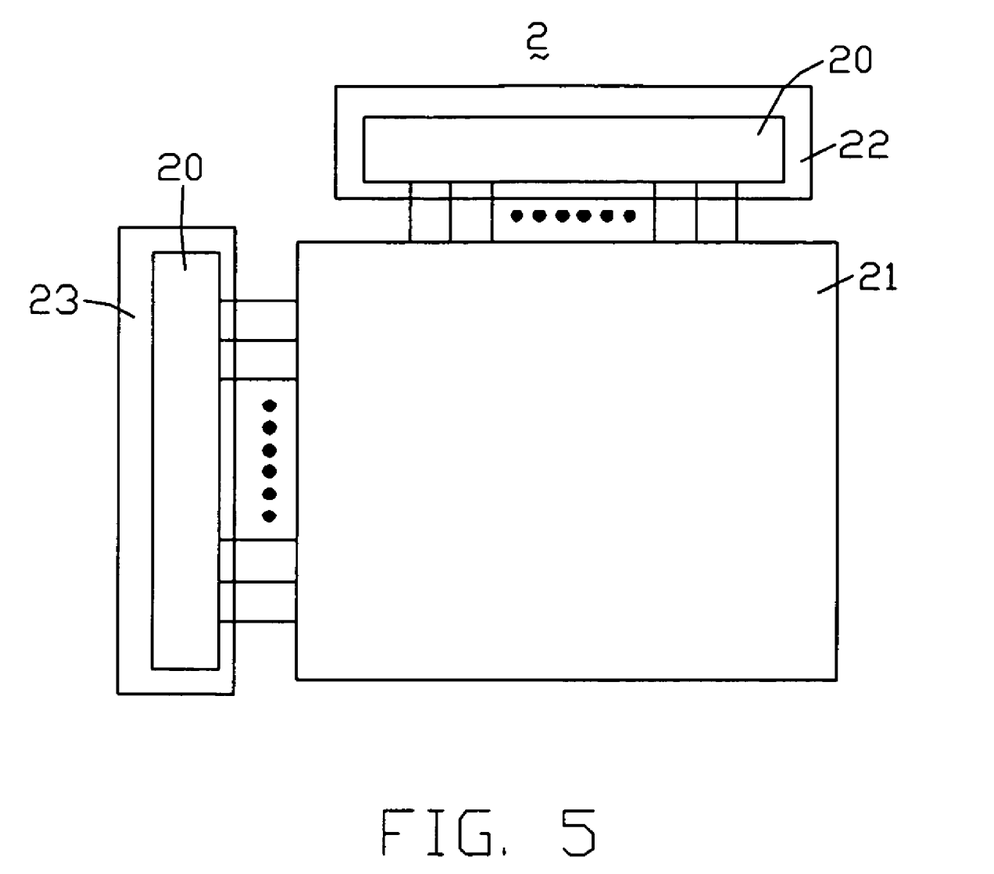
FIG. 5 illustrates one embodiment of a liquid crystal display employing at least one of the shift register.

FIG. 5 illustrates one embodiment of a liquid crystal display 2 employing at least one of the shift register 20. The liquid crystal display may employ the shift register 20 in order to reduce power consumption. In one embodiment, the liquid crystal display 2 includes a liquid crystal panel 21, a gate driving circuit 23, and a data driving circuit 22. The data driving circuit 22 and the gate driving circuit 23 each include at least one shift register 20. Each shift register 20 provides a plurality of shift register signals sequentially to the liquid crystal panel 21.

It is to be further understood that even though numerous characteristics and advantages of the present inventive embodiments have been set out in the foregoing description, together with details of the structures and functions of the embodiments, the disclosure is illustrative only, and that changes may be made in detail, especially in matters of shape, size, and arrangement of parts within the principles of the present disclosure to the full extent indicated by the broad general meaning of the terms in which the appended claims are expressed.

What is claimed is:

1. A shift register comprising:
    at least two clock transmission lines configured for transmitting a first clock pulse and a second clock pulse, wherein the first clock pulse and the second clock pulse have an amplitude, a duty ratio, and a frequency, and wherein the first clock pulse has an inverse phase relative to a phase of the second clock pulse;
    a plurality of stages receiving the clock pulses from the at least two clock transmission lines, and outputting a plurality of output-signals in sequence, wherein a first alternating stage of the plurality of stages receives the first clock pulse, and wherein a second alternating stage of the plurality of stages receives the second clock pulse;
    wherein each of the plurality of stages comprises:

a voltage high input, a voltage low input, a first output, a second output, and an input, wherein the voltage high input receives a high-level voltage signal, wherein the voltage low input receives a low-level voltage signal, and wherein a first output of the first alternating stage inputs a signal into the input of the second alternating stage;

an input circuit configured receiving one of the first clock pulse and the second clock pulse for generating a pulse signal to the second output, wherein the pulse signal is configured according to said one of the first clock pulse and the second clock pulse, and an input from one of the first alternating stage and the second alternating stage;

a first inverter comprising an input terminal connected to the second output;

a voltage circuit configured for providing a high-level signal and a low-level signal under control of the input, an output of the first inverter, the first output, and the second output to a common node of the voltage circuit; and a second inverter comprising an output connected to the first output, and an input connected to the common node.

2. The shift register of claim 1, wherein the voltage circuit comprises a pull-up circuit and a pull-down circuit.

3. The shift register of claim 2, wherein the pull-up circuit comprises P-channel metal oxide semiconductor transistors.

4. The shift register of claim 2, wherein pull-down circuit comprises N-channel metal oxide semiconductor transistors.

5. The shift register of claim 1, wherein the input circuit comprises an AND gate, an OR gate, and a clock input, wherein the OR gate comprises a first input terminal connected to the input and a second input terminal connected to the first output, and an output terminal connected to an input terminal of the AND gate, wherein the AND gate comprises an input terminal connected to one of the at least two clock transmission lines, and an output terminal connected to the second output.

6. A shift register comprising:
a plurality of stages receiving a clock signal from a clock signal source;
a first output configured for outputting a signal to a next stage from the plurality of stages according to a received input signal;
wherein each stage from the plurality of stages comprises:
a first output circuit;
a second output circuit;
a third output circuit;
a fourth output circuit, wherein the first output circuit, the second output circuit, the third output circuit, and the fourth output circuit are connected to a common node common to the first output circuit, the second output circuit, the third output circuit, and the fourth output circuit;
a high level input configured for receiving a high-level voltage signal;
a low level input configured for receiving a low-level voltage signal;
a second output configured for outputting a shift register signal, wherein a next stage of each of the plurality of stages output a shifted signal from a previous stage of the plurality of stages;
an input circuit configured for generating a pulse signal to the second output according to the signal outputted by the first output, and the clock signal;
a first inverter comprising an input and an output, wherein the input of the first inverter connects to the second output;

a second inverter comprising an input connected to the common node, the second inverter further comprising an output connected to the first output;

wherein the first output circuit is configured for providing a high-level signal to the common node via the input and the output of the first inverter, the second output circuit is configured for providing a high-level signal to the common node via the first output and second output, the third output circuit is configured for providing a low-level signal to the common node via the first output and the output of the first inverter, the fourth output circuit is configured for providing a low-level signal to the common node via the second output and the input;

wherein one of the first output circuit, the second output circuit, the third output circuit, and the fourth output circuits is switched on during a period of the clock signal.

7. The shift register of claim 6, wherein the first output circuit comprises a first transistor and a second transistor, the first transistor comprising a gate electrode connected to the input, a source electrode connected to the high level input, and a drain electrode connected to a source electrode of the second transistor, wherein the second transistor comprises a gate electrode connected to the output of the first inverter, and a drain electrode connected to the common node.

8. The shift register of claim 7, wherein the first transistor and the second transistor are P-channel metal oxide semiconductor transistors.

9. The shift register of claim 6, wherein the second output circuit comprises a third transistor and a fourth transistor, the third transistor comprising a gate electrode connected to the second output, a source electrode connected to the high level input, and a drain electrode connected to a source electrode of the fourth transistor, wherein the fourth transistor comprises a gate electrode connected to the first output, and a drain electrode connected to the common node.

10. The shift register of claim 9, wherein the third transistor and the fourth transistor are P-channel metal oxide semiconductor transistors.

11. The shift register of claim 6, wherein the third output circuit comprises a fifth transistor and a sixth transistor, the fifth transistor comprising a gate electrode connected to the first output, a source electrode connected to a drain electrode of the sixth transistor, and a drain electrode connected to the common node, wherein the sixth transistor comprises a gate electrode connected to the output of the first inverter and a source electrode connected to the low level input.

12. The shift register of claim 11, wherein the fifth transistor and the sixth transistor are N-channel metal oxide semiconductor transistors.

13. The shift register of claim 6, wherein the fourth output circuit comprises a seventh transistor and an eighth transistor, the seventh transistor comprising a gate electrode connected to the second output, a source electrode connected to a drain electrode of the eighth transistor, and a drain electrode connected to the common node, wherein the eighth transistor comprises a gate electrode connected to the input and a source electrode connected to the low level input.

14. The shift register of claim 13, wherein the seventh transistor and eighth transistor are N-channel metal oxide semiconductor transistors.

15. The shift register of claim 7, further comprising a third inverter, wherein the third inverter comprises an input connected the output of the first inverter, and an output connected to gate electrode of the second transistor.

16. A liquid crystal display comprising:
a liquid crystal panel;

a gate driving circuit; and a data driving circuit;

wherein each of the gate driving circuit and the data driving circuit comprises at least one shift register, wherein each of the shift registers comprises a plurality of shift register units, each shift register unit comprising:

a first output configured for outputting a signal to a next stage from the plurality of stages according to a received input signal;

wherein each stage from the plurality of stages comprises:

a first output circuit;

a second output circuit;

a third output circuit;

a fourth output circuit, wherein the first output circuit, the second output circuit, the third output circuit, and the fourth output circuit are connected to a common node common to the first output circuit, the second output circuit, the third output circuit, and the fourth output circuit;

a high level input configured for receiving a high-level voltage signal;

a low level input configured for receiving a low-level voltage signal;

a second output configured for outputting a shift register signal, wherein a next stage of each of the plurality of stages output a shifted signal from a previous stage of the plurality of stages;

an input circuit configured for generating a pulse signal to the second output according to the signal outputted by the first output, and the clock signal;

a first inverter comprising an input and an output, wherein the input of the first inverter connects to the second output;

a second inverter comprising an input connected to the common node, the second inverter further comprising an output connected to the first output;

wherein the first output circuit is configured for providing a high-level signal to the common node via the input and the output of the first inverter, the second output circuit is configured for providing a high-level signal to the common node via the first output and second output, the third output circuit is configured for providing a low-level signal to the common node via the first output and the output of the first inverter, the fourth output circuit is configured for providing a low-level signal to the common node via the second output and the input;

wherein one of the first output circuit, the second output circuit, the third output circuit, and the fourth output circuits is switched on during a period of the clock signal.

17. The liquid crystal display of claim 16, wherein the input circuit comprises an and gate, an or gate, and a clock input, the or gate comprising two input terminals connected the input and the first output, and an output terminal connected to an input terminal of the and gate, wherein the and gate comprises an input terminal connected to the clock input and an output terminal connected to the second output, adjacent two of the shift register units having clock signals applied thereof with different phases.

18. The liquid crystal display of claim 16, wherein the first output circuit comprises a first transistor and a second transistor, the first transistor comprising a gate electrode of the first transistor connected to the input, a source electrode connected to the high level input, and a drain electrode connected to a source electrode of the second transistor, wherein the second transistor comprises a gate electrode connected to the output of the first inverter, and a drain electrode connected the common node; the second output circuit comprising a third transistor and a fourth transistor, the third transistor comprising a gate electrode connected to the second output, a source electrode connected to the high level input, and a drain electrode connected to a source electrode of the fourth transistor, wherein the fourth transistor comprises a gate electrode connected to the first output, and a drain electrode connected to the common node; the third output circuit comprising a fifth transistor and a sixth transistor, the fifth transistor comprising a gate electrode connected to the first output, a source electrode connected to a drain electrode of the sixth transistor, and a drain electrode connected to the common node, wherein the sixth transistor comprises a gate electrode connected to output of the first inverter and a source electrode connected to the low level input; the fourth output circuit comprising a seventh transistor and an eighth transistor, the seventh transistor comprising a gate electrode connected to the second output, a source electrode connected to a drain electrode of the eighth transistor, and a drain electrode connected to the common node, wherein the eighth transistor comprised a gate electrode connected to the input and a source electrode connected to the low level input.

19. The liquid crystal display of claim 16, wherein the shift register further comprises a third inverter, the third inverter comprising an input connected to the output of the first inverter, and an output connected to gate electrode of the second transistor.

* * * * *